United States Patent
Kobayashi et al.

(10) Patent No.: US 9,994,957 B2
(45) Date of Patent: Jun. 12, 2018

(54) PRELIMINARY TREATMENT METHOD FOR WORKPIECE

(71) Applicant: HONDA MOTOR CO., LTD., Tokyo (JP)

(72) Inventors: Koji Kobayashi, Tochigi (JP); Junya Funatsu, Tochigi (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days. days.

(21) Appl. No.: 14/778,309

(22) PCT Filed: May 30, 2014

(86) PCT No.: PCT/JP2014/064466
§ 371 (c)(1),
(2) Date: Sep. 18, 2015

(87) PCT Pub. No.: WO2014/192928
PCT Pub. Date: Dec. 4, 2014

(65) Prior Publication Data
US 2016/0281237 A1    Sep. 29, 2016

(30) Foreign Application Priority Data
May 31, 2013   (JP) .................................. 2013-116035

(51) Int. Cl.
*H05H 1/00* (2006.01)
*C23C 16/50* (2006.01)
(Continued)

(52) U.S. Cl.
CPC .............. *C23C 16/50* (2013.01); *C23C 16/02* (2013.01); *C23C 16/0227* (2013.01);
(Continued)

(58) Field of Classification Search
CPC . C23C 16/0227; C23C 16/0245; C23C 16/50; C23C 16/26
USPC .................................. 427/534, 539; 134/1.1
See application file for complete search history.

(56) References Cited

U.S. PATENT DOCUMENTS 6,087,025 A * 7/2000 Dearnaley ........... C23C 16/0272
                                                   428/213
6,440,864 B1 * 8/2002 Kropewnicki ........ B08B 7/0035
                                                   134/1.2
(Continued)

FOREIGN PATENT DOCUMENTS

JP    09-195036    7/1997
JP    10-110269    4/1998
(Continued)

OTHER PUBLICATIONS

International Search Report, dated Sep. 9, 2014 (Sep. 9, 2014).

*Primary Examiner* — Michael P Wieczorek
(74) *Attorney, Agent, or Firm* — Rankin, Hill & Clark LLP

(57) ABSTRACT

Provided is a preliminary treatment method for a workpiece capable of shortening a cycle time by preventing a nodule from being formed on a carbon film. The preliminary treatment method for the workpiece is performed before a carbon film is formed on a surface of a workpiece W. A bias voltage is applied to the workpiece W disposed in a treatment space S maintained at a predetermined vacuum degree while an oxygen gas is supplied to the treatment space S before a material gas is supplied to the treatment space S, oxygen plasma is generated along the surface of the workpiece W, and oxygen, hydrogen, or water stuck to the surface of the workpiece W is removed.

5 Claims, 5 Drawing Sheets

(51) Int. Cl.

| | |
|---|---|
| *C23C 16/26* | (2006.01) |
| *C23C 16/515* | (2006.01) |
| *C23C 16/02* | (2006.01) |
| *C23C 16/04* | (2006.01) |
| *H01J 37/32* | (2006.01) |
| *C23C 16/455* | (2006.01) |

(52) U.S. Cl.
CPC ............ *C23C 16/045* (2013.01); *C23C 16/26* (2013.01); *C23C 16/455* (2013.01); *C23C 16/515* (2013.01); *H01J 37/32009* (2013.01)

(56) References Cited

U.S. PATENT DOCUMENTS

| | | | |
|---|---|---|---|
| 6,465,057 B1 * | 10/2002 | Nakahigashi | ............ C23C 16/26 |
| | | | 427/535 |
| 8,080,108 B2 * | 12/2011 | Nadaud | ................ C03C 23/006 |
| | | | 134/1.1 |
| 8,105,660 B2 * | 1/2012 | Tudhope | ............... C23C 16/045 |
| | | | 427/237 |
| 2009/0236014 A1 * | 9/2009 | Wilson | ...................... C23C 8/10 |
| | | | 148/284 |

FOREIGN PATENT DOCUMENTS

| | | |
|---|---|---|
| JP | 2000-297373 | 10/2000 |
| JP | 3555844 | 5/2004 |
| JP | 2005-089735 | 4/2005 |
| JP | 2010-531931 | 9/2010 |
| JP | 2011-162857 | 8/2011 |
| JP | 4973971 | 4/2012 |
| WO | 2009/006178 | 1/2009 |

* cited by examiner

PRELIMINARY TREATMENT METHOD FOR WORKPIECE

TECHNICAL FIELD

The present invention relates to a preliminary treatment method for a workpiece which is performed before a carbon film such as a diamond-like carbon (DLC) film is formed on a surface of a workpiece by using a plasma CVD device.

BACKGROUND ART

Hitherto, there has been a need to reduce mechanical loss in order to reduce an energy consumption amount in a sliding member such as a cylinder block and a piston used in lubricating oil. Here, a reduction in the friction of the sliding member is examined.

For example, there is known to provide a carbon film such as a diamond-like carbon film (hereinafter, simply referred to as a DLC film) is formed on the surface of the sliding member in order to reduce the friction of the sliding member (for example, see Patent Documents 1 and 2).

When the carbon film is composed on the surface of the sliding member, a conductive workpiece such as a cylinder block and a piston is first disposed in a treatment space maintained in a predetermined vacuum degree. Then, an anode is disposed in the treatment space.

Next, a bias voltage is applied to the anode by setting the workpiece as a cathode while a material gas formed of a hydrocarbon compound such as acetylene is supplied to the treatment space maintained in a predetermined vacuum degree.

In this way, since carbon plasma caused by the material gas such as acetylene is generated along the shape of the surface of the workpiece, the carbon film such as a DLC film may be formed on the surface of the workpiece.

At this time, when the workpiece is a hollow cylindrical member such as a cylinder block, both ends thereof are sealed by a pair of cylindrical sealing members composed of an insulator, and hence the inside of the sealing member and the inside of the workpiece sealed by the sealing member may be formed as the treatment space. In this case, the carbon film is formed on the inner peripheral surface of the hollow cylindrical member.

Further, when the workpiece is a solid member such as a piston, the workpiece is disposed inside a chamber, and hence the inside of the chamber may be formed as the treatment space. In this case, the carbon film is formed on the outer surface of the solid member.

CITATION LIST

Patent Document

Patent Document 1: Japanese Patent No. 3555844
Patent Document 2: Japanese Patent No. 4973971

DISCLOSURE OF THE INVENTION

Problem to be Solved by the Invention

However, when oxygen, hydrogen, or water is stuck to the workpiece and the inside of the treatment space in a case where a carbon film such as a DLC film is formed on the surface of the workpiece as described above, a problem arises in that a tubercle called a nodule is formed on the carbon film.

When the nodule is formed on the carbon film, the friction of the surface of the workpiece may not be sufficiently reduced. In order to remove oxygen, hydrogen, or water stuck to the workpiece and the inside of the treatment space, there is a need to depressurize the inside of the treatment space to a predetermined vacuum degree and to further perform a deaeration treatment for a long time as a preliminary treatment. However, a problem arises in that the cycle time increases in such a case.

Further, as a method of cleaning the carbon film stuck to the inside of the treatment space, a chemical gasification method using fluorine ($C+2F_2 \rightarrow CF_4$) is known. However, $CF_4$ needs to be removed due to the harmfulness thereof. Thus, a detoxifying facility needs to be provided newly for this purpose. Further, since the fluorine gas has a high reducing property, there is a concern that the inside of the treatment space may be corroded.

The invention is made to solve such a problem, and an object thereof is to provide a preliminary treatment method for a workpiece capable of reliably removing oxygen, hydrogen, or water stuck to a surface of a workpiece and of preventing a nodule from being formed on a carbon film while not generating a toxic gas, not needing an additional treatment facility, and preventing corrosion inside the treatment space. Further, another object of the invention is to provide a preliminary treatment method for a workpiece capable of reliably removing oxygen, hydrogen, or water stuck to the surface of the workpiece in a short time, and thereby capable of shortening a cycle time.

Means for Solving Problem

In order to achieve the above-described object, according to the invention, provided is a preliminary treatment method for a workpiece which is performed before a step of disposing a conductive workpiece in a treatment space maintained in a predetermined vacuum degree, applying a bias voltage to an anode disposed in the treatment space by setting the workpiece as a cathode while a material gas formed of a hydrocarbon compound is supplied to the treatment space, generating plasma of the material gas along a surface of the workpiece, and forming a carbon film on the surface of the workpiece, wherein a bias voltage is applied to the workpiece disposed in the treatment space while an oxygen gas is supplied to the treatment space before the material gas is supplied to the treatment space, oxygen plasma is generated along the surface of the workpiece, and oxygen, hydrogen, or water stuck to the surface of the workpiece is removed by the oxygen plasma.

In the preliminary treatment method for the workpiece of the invention, a conductive workpiece is disposed in the treatment space maintained in a predetermined vacuum degree, and then the oxygen gas is supplied to the treatment space before the material gas is supplied to the treatment space. Then, a bias voltage is applied to the anode (positive electrode) by setting the workpiece as a cathode (negative electrode), and oxygen plasma is generated along the surface of the workpiece.

In this way, it is possible to reliably remove oxygen, hydrogen, or water stuck to the surface of the workpiece by the oxygen plasma in a short time. Accordingly, according to the preliminary treatment method for the workpiece of the invention, a toxic gas is not generated, an additional facility is not needed, and the corrosion inside the treatment space is prevented. Thus, it is possible to reliably prevent the nodule from being formed in the carbon film and to further shorten the cycle time.

In the preliminary treatment method for the workpiece of the invention, it is preferable that, when the workpiece is formed in a cylindrical shape, both ends of the workpiece is sealed by a pair of cylindrical sealing members having an insulation property, the treatment space is formed by inside the sealing member and the workpiece sealed by the sealing member, and it is preferable that the anode is disposed in the sealing member. With such a configuration, it is possible to form the carbon film on the inner peripheral surface of the workpiece formed in a cylindrical shape.

Further, in the preliminary treatment method for the workpiece of the invention, it is preferable that, when the workpiece is formed as a solid shape, the treatment space is formed inside a chamber for disposing the workpiece therein, and the anode is disposed inside the chamber. With such a configuration, it is possible to form the carbon film on the outer surface of the workpiece formed in a solid shape.

Further, in the preliminary treatment method for the workpiece of the invention, it is preferable that the carbon film accumulated inside the treatment space is removed by the oxygen plasma. With such a configuration, it is possible to clean the inside of the treatment space whenever the preliminary treatment for the workpiece is performed, and hence to prevent a problem in which the carbon film accumulated inside the treatment space disturbs the operation of the device or causes the contamination thereof

MODE(S) FOR CARRYING OUT THE INVENTION

Next, an embodiment of the invention will be described in detail with reference to the accompanying drawings.

Figure 1:
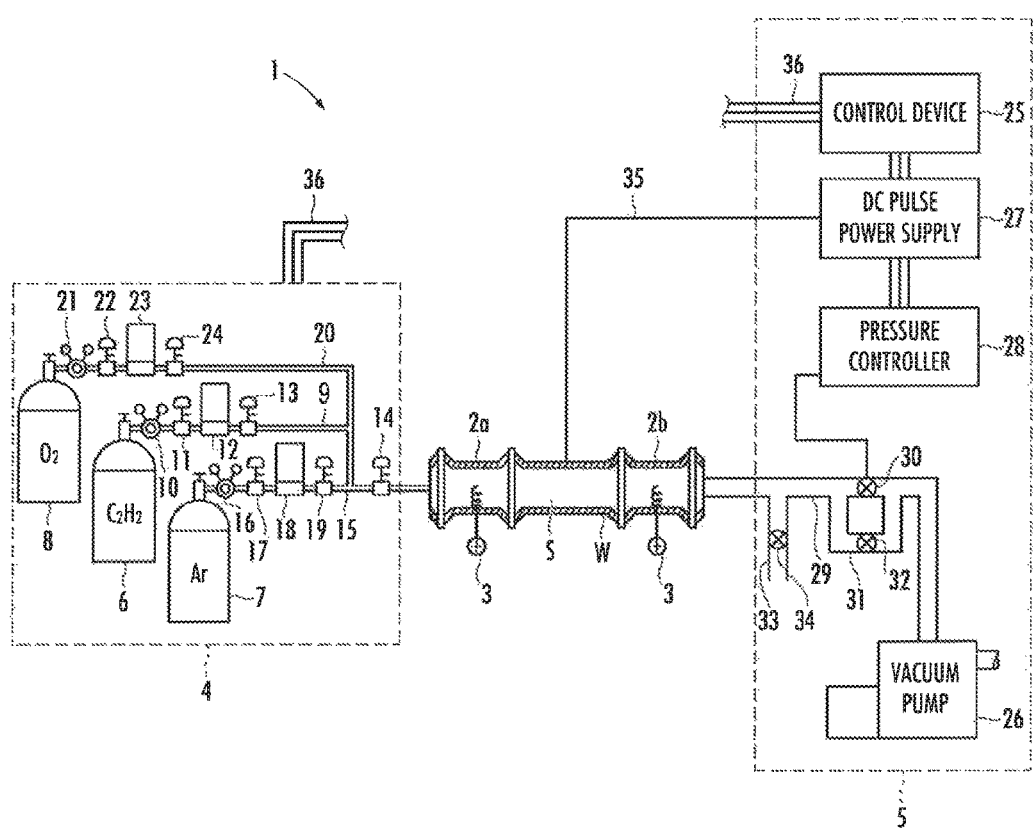
FIG. 1 is a system configuration diagram illustrating a configuration example of a plasma CVD device that is used in a preliminary treatment method for a workpiece of the invention.

A preliminary treatment method for a workpiece of the invention is used to form a carbon film on an inner surface of a conductive workpiece W having a hollow cylindrical shape by, for example, a plasma CVD device 1 shown in FIG. 1.

The plasma CVD device 1 includes a pair of sealing members 2a and 2b which seals both ends of the workpiece W having a hollow cylindrical shape, anodes (positive electrodes) 3 and 3 which are attached to the sealing members 2a and 2b, a gas supply subsystem 4, and a process control subsystem 5.

The workpiece W is, for example, a cylinder block of an internal combustion engine and serves as a cathode (negative electrode). Each of the sealing members 2a and 2b is a bottomed cylinder body that is formed as an insulator, and communicates with the inside of the workpiece W at the opening end. Each of the anodes 3 and 3 is formed as a bar-shaped electrode, and is inserted from a hole portion (not shown) formed in each of the sealing members 2a and 2b into inside of each of the sealing members 2a and 2b. The anodes 3 and 3 and the workpiece W as the cathode are insulated by the sealing members 2a and 2b as the insulator.

The gas supply subsystem 4 includes an acetylene gas supply container 6, an argon gas supply container 7, and an oxygen gas supply container 8.

The cavity of the workpiece W is connected to the acetylene gas supply container 6 through a pressure gauge 10, a flow amount control device primary valve 11, a flow amount control device 12, a flow amount control device secondary valve 13, a switching valve 14, and a sealing member 2a by a guide pipe 9. A guide pipe 15 is connected to the argon gas supply container 7, and the guide pipe 15 is connected to the guide pipe 9 at the upstream side of the switching valve 14 through a pressure gauge 16, a flow amount control device primary valve 17, a flow amount control device 18, and a flow amount control device secondary valve 19.

Further, a guide pipe 20 is connected to the oxygen gas supply container 8, and the guide pipe 20 is connected to the guide pipe 9 at the upstream side of the switching valve 14 through a pressure gauge 21, a flow amount control device primary valve 22, a flow amount control device 23, and a flow amount control device secondary valve 24.

The process control subsystem 5 includes a control device 25 which is configured of a personal computer or the like, a vacuum pump 26 which is controlled by the control device 25, a DC pulse power supply 27, and a pressure controller 28. The vacuum pump 26 is connected to the cavity of the workpiece W through a switching valve 30 and the sealing member 2b by a guide pipe 29.

The guide pipe 29 includes a slow pipe 31 which connects the primary side and the secondary side of the switching valve 30, and a slow valve 32 is disposed in the slow pipe 31. Further, the guide pipe 29 includes a vent pipe 33 between the slow pipe 31 and the sealing member 2b, and a vent valve 44 is disposed in the vent pipe 33.

The DC pulse power supply 27 includes a DC cable 35, and the DC cable 35 is connected to the outer surface of the workpiece W. Further, the pressure controller 28 is electrically connected to the switching valve 30 provided in the guide pipe 29, the slow valve 32 provided in the slow pipe 31, and the vent valve 34 provided in the vent pipe 33.

Further, the control device 25 is electrically connected to the gas supply subsystem 4 through an interface cable 36. As a result, the control device 25 controls the flow amount control device primary valve 11, the flow amount control device 12, the flow amount control device secondary valve 13, and the switching valve 14 provided in the guide pipe 9. Further, the control device 25 controls the flow amount control device primary valve 17, the flow amount control device 18, and the flow amount control device secondary valve 19 provided in the guide pipe 15. Furthermore, the control device 25 controls the flow amount control device primary valve 22, the flow amount control device 23, and the flow amount control device secondary valve 24 provided in the guide pipe 20.

Next, a preliminary treatment method for a workpiece W of an embodiment using the plasma CVD device 1 shown in FIG. 1 will be described with reference to FIG. 2.

Figure 2:
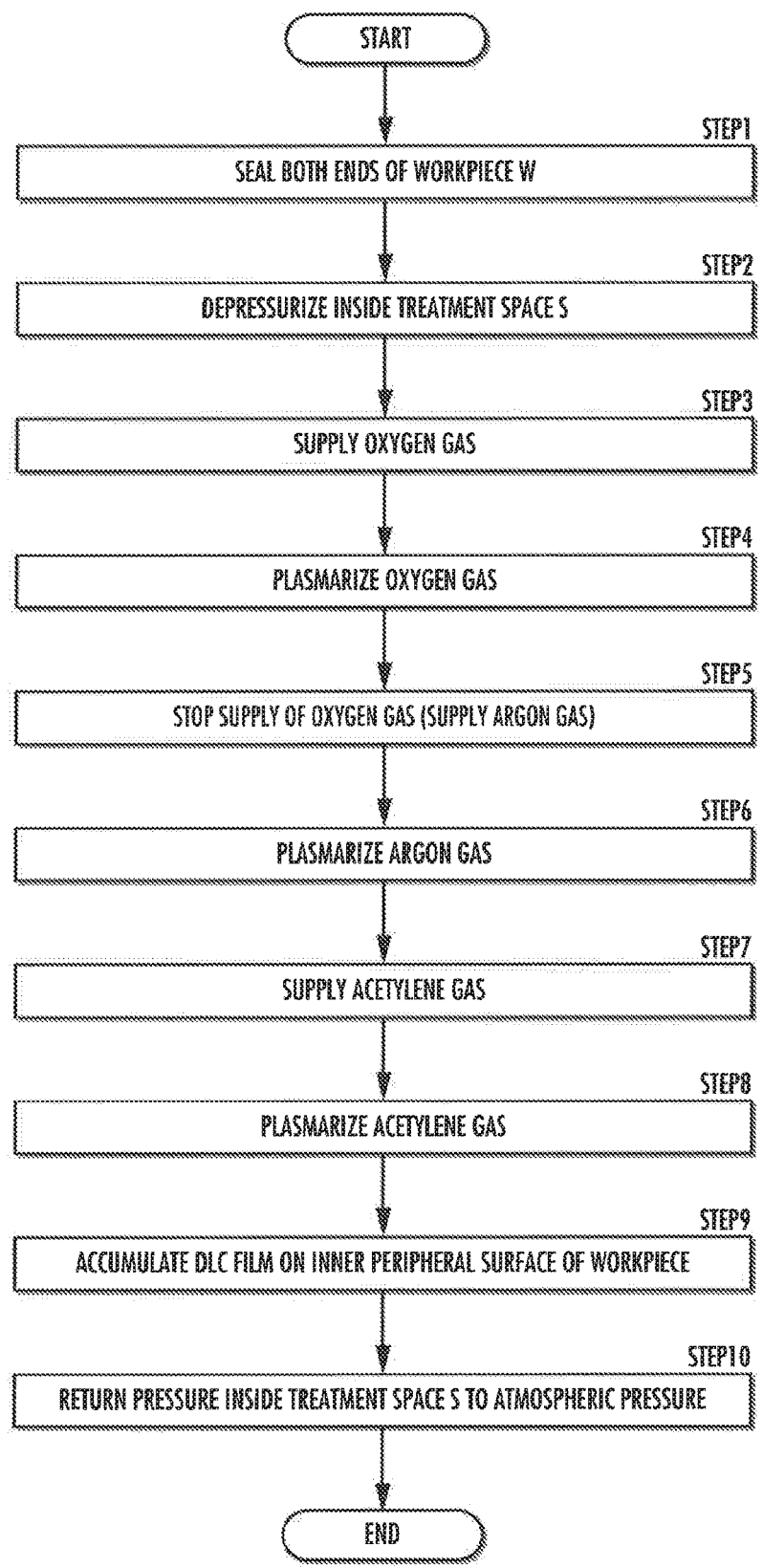
FIG. 2 is a flowchart illustrating the preliminary treatment method for the workpiece of the invention.

In the preliminary treatment method for the workpiece of the embodiment, first, both ends of the workpiece W are sealed by the sealing members 2a and 2b in STEP 1 shown in FIG. 2. Next, in STEP 2, a treatment space S which is formed by the inside of the cavity of the workpiece W and the sealing members 2a and 2b is depressurized in a predetermined vacuum degree.

In order to reduce the pressure, the control device 25 first operates the vacuum pump 26 while the switching valve 30 is in a closed state and the slow valve 32 is opened through the pressure controller 28. Then, a pressure at the primary side and the secondary side of the switching valve 30 is depressurized to a predetermined vacuum degree at which the switching valve 30 is operable.

Next, when a pressure at the primary side and the secondary side of the switching valve 30 is depressurized to the above-described predetermined vacuum degree, the control device 25 opens the switching valve 30 at a predetermined opening degree while the slow valve 32 is closed through the pressure controller 28. As a result, the inside of the treatment space S is depressurized so that the vacuum degree becomes, for example, 1 to 100 Pa.

At this time, the flow amount control device primary valve 11, the flow amount control device secondary valve 13, and the switching valve 14 provided in the guide pipe 9 are closed, the flow amount control device primary valve 17 and the flow amount control device secondary valve 19 provided in the guide pipe 15 are closed, and the flow amount control device primary valve 22 and the flow amount control device secondary valve 24 provided in the guide pipe 20 are closed.

When the inside of the treatment space S is depressurized as described above, an oxygen gas is supplied into the treatment space S in STEP 3. In a case where the oxygen gas is supplied, first the control device 25 opens the switching valve 14 provided in the guide pipe 9 of the gas supply subsystem 4 and the flow amount control device primary valve 17 and the flow amount control device secondary valve 19 provided in the guide pipe 15, and supplies an argon gas from the argon gas supply container 7 into the treatment space S At the same time, the control device 25 opens the flow amount control device primary valve 22 and the flow amount control device secondary valve 24 provided in the guide pipe 20 of the gas supply subsystem 4, and supplies an oxygen gas from the oxygen gas supply container 8 into the treatment space S. At this time, only the oxygen gas may be supplied without supplying the argon gas.

In a case where the argon gas is supplied, the flow amount of the argon gas is controlled in the range of, for example, 100 to 2000 sccm by the flow amount control device 18, and the flow amount of the oxygen gas is controlled in the range of, for example, 500 to 4000 sccm by the flow amount control device 23. Then, the control device 25 opens the switching valve 30 at a predetermined opening degree through the pressure controller 28 so that the inside of the treatment space S is maintained at a vacuum degree of, for example, 5 to 150 Pa.

Next, in STEP 4, oxygen plasma is generated inside the treatment space S. For the generation of the oxygen plasma, the control device 25 applies a pulse current of, for example, 2 to 100 A from the DC pulse power supply 27 to the workpiece W for, for example, 30 to 200 seconds through the DC cable 35. In this way, since a negative bias voltage is applied to the workpiece W so that the workpiece W serves as a cathode, the oxygen gas is plasmarized between the workpiece W and the anodes 3 and 3, and oxygen plasma is generated along the inner peripheral surface of the workpiece W.

At this time, the density of the oxygen plasma becomes extremely high inside the treatment space S due to a hollow cathode effect. Accordingly, it is possible to remove oxygen, hydrogen, water, or dust stuck to the surface of the workpiece W by the oxygen plasma. At the same time, it is possible to decompose and remove a carbon film such as a DLC film accumulated inside the sealing members 2a and 2b forming the treatment space S and hence to clean the inside of the sealing members 2a and 2b.

As a result, the preliminary treatment for the workpiece W ends by the operations of STEP 2 to STEP 5.

Next, in STEP 5, the control device 25 closes the flow amount control device primary valve 22 and the flow amount control device secondary valve 24 provided in the guide pipe 20 of the gas supply subsystem 4 so as to stop the supply of the oxygen gas. As a result, only the argon gas is supplied to the treatment space S.

Further, in a case where only the oxygen gas is supplied, the supply of the oxygen gas is stopped, and then the control device 25 opens the flow amount control device primary valve 17 and the flow amount control device secondary valve 19 provided in the guide pipe 15 of the gas supply subsystem 4 so as to supply an argon gas from the argon gas supply container 7 into the treatment space S.

In a case where the argon gas is supplied, the flow amount of the argon gas is controlled in the range of, for example, 100 to 2000 sccm by the flow amount control device 18. Then, the control device 25 opens the switching valve 30 at a predetermined opening degree through the pressure controller 28 so that the inside of the treatment space S is maintained at a vacuum degree of, for example, 5 to 150 Pa.

Next, in STEP 6, argon plasma is generated inside the treatment space S. For the generation of the argon plasma, the control device 25 applies a pulse current of, for example, 2 to 100 A from the DC pulse power supply 27 to the workpiece W for, for example, 3 to 15 seconds through the DC cable 35. In this way, since a negative bias voltage is applied to the workpiece W so that the workpiece W serves as a cathode, the argon gas is plasmarized between the workpiece W and the anodes 3 and 3.

At this time, the oxygen gas which remains inside the treatment space S due to the operation of STEP 4 is discharged to the outside of the treatment space S by the argon gas supplied as described above.

Next, in STEP 7, an acetylene gas is supplied as a material gas of a DLC film into the treatment space S. In a case where the acetylene gas is supplied, the control device 25 opens the flow amount control device primary valve 11 and the flow amount control device secondary valve 13 provided in the guide pipe 9 of the gas supply subsystem 4 so as to supply the acetylene gas from the acetylene gas supply container 6 into the treatment space S.

At this time, the flow amount of the argon gas is controlled in the range of, for example, 100 to 2000 sccm by the flow amount control device 18, and the flow amount of the acetylene gas is controlled in the range of, for example, 500 to 4000 sccm by the flow amount control device 12. Then, the control device 25 opens the switching valve 30 at a predetermined opening degree through the pressure controller 28 so that the inside of the treatment space S is maintained at a vacuum degree of, for example, 5 to 150 Pa.

Next, in STEP 8, acetylene plasma is generated inside the treatment space S. For the generation of the acetylene plasma, the control device 25 applies a pulse current of, for example, 2 to 100 A from the DC pulse power supply 27 to the workpiece W for, for example, 5 to 200 seconds through the DC cable 35. In this way, since a negative bias voltage is applied to the workpiece W so that the workpiece W serves as a cathode, the acetylene gas is plasmarized between the workpiece W and the anodes 3 and 3, and mainly carbon plasma is generated along the inner peripheral surface of the workpiece W.

In this way, in STEP 9, the carbon plasma is attracted to the inner peripheral surface of the workpiece W as the cathode, so that the DLC film is formed by the accumulation thereof. Further, since the control device 25 adjusts the duty cycle of the pulse current, the acetylene gas and the argon gas are supplemented when the duty cycle is off. As a result, it is possible to form the DLC film having a uniform thickness on the inner peripheral surface of the workpiece W.

When the DLC film is formed on the inner peripheral surface of the workpiece W, the pressure inside the treatment space S is returned to the atmospheric pressure in STEP 10, and the operation ends. In order to return the pressure inside the treatment space S to the atmospheric pressure, the control device 25 closes the switching valve 14 provided in the guide pipe 9 of the gas supply subsystem 4, the flow amount control device primary valve 11 and the flow amount control device secondary valve 13 provided in the guide pipe 9, and the flow amount control device primary valve 17 and the flow amount control device secondary valve 19 provided in the guide pipe 15. Then, the control device 25 stops the vacuum pump 26 so as to close the switching valve 30 through the pressure controller 28 and to insulate the vacuum pump 26 side, and fully opens the vent valve 34 provided in the vent pipe 33, so that the pressure is returned to the atmospheric pressure.

As described above, in the preliminary treatment method of the embodiment, the oxygen gas, the argon gas, and the acetylene gas are plasmarized. In order to do so, a case is described in which a bias voltage caused by a pulse current is sequentially applied to each of the supplied gases. However, since there is a need to actually maintain the plasma state at all times in order to prevent the occurrence of the nodule, there is a need to instantly and continuously apply a bias voltage to each gas in response to the supply of each gas.

Next, an effect of the preliminary treatment method of the embodiment will be described.

Figure 3:
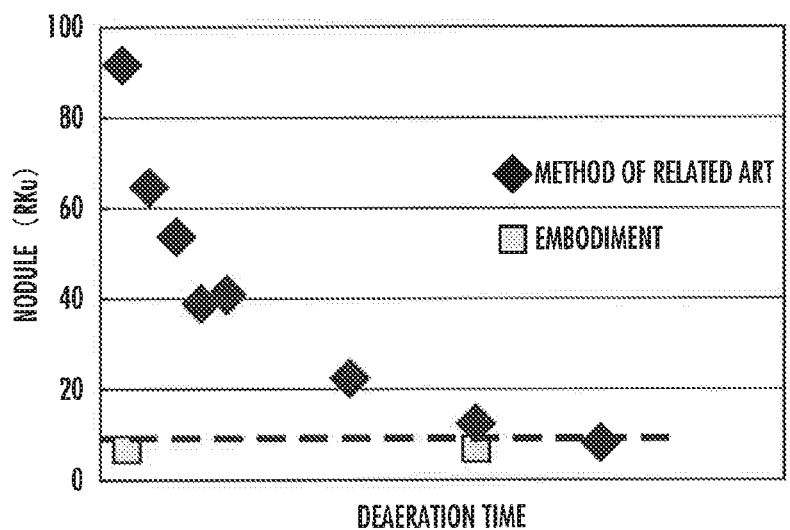
FIG. 3 is a graph illustrating a relation between a nodule and a deaeration time of a treatment space.

In the case of the related art in which the preliminary treatment method of the present embodiment is not performed, a deaeration treatment needs to be performed in order to remove oxygen, hydrogen, or water stuck to a surface expected to have the DLC film in the workpiece W instead of the operations of STEP 3 to STEP 6 after the inside of the treatment space S is depressurized to the predetermined vacuum degree in STEP 2 shown in FIG. 2. FIG. 3 illustrates a relation between a nodule and a deaeration treatment time.

The nodule is expressed by Kurtosis Rku as a statistical numerical value that represents the distribution of the surface roughness per a predetermined minute area of the surface of the DLC film. The Kurtosis Rku is a value which is obtained by dividing the average of the fourth power of the equation Z(x) representing the curve of the roughness per a reference length measured by an atomic force microscope (AFM) by the fourth power of the root mean square value for a predetermined minute area (for example, a range of 0.4 mm×0.1 mm) of the surface of the DLC film. The Rku value is expressed by the following equation (1). The Kurtosis Rku is defined based on JIS B0601.

$$Rku = \frac{1}{Rq^4}\left[\frac{1}{lr}\int_0^{lr} Z^4(x)\,dx\right] \quad (1)$$

From FIG. 3, the nodule of the DLC film to be formed has a value of about 100 in Kurtosis Rku in a case where the deaeration treatment is not performed. It is desirable that the nodule of the DLC film to be formed is about 10 as the value of Kurtosis Rku. Here, it is obvious that the deaeration treatment needs to be performed for a considerable amount of time in order to obtain the nodule in such a degree.

On the other hand, in a case where the preliminary treatment method of the present embodiment is performed, it is obvious that the value of Kurtosis Rku may be a value of about 10 even when the deaeration treatment is not performed. Accordingly, there is no need for time required for the deaeration treatment by performing the preliminary treatment method of the present embodiment. Thus, it is obvious that the cycle time may be shortened.

Further, in a related art in which the preliminary treatment method of the present embodiment is not performed, a problem arises in that a carbon film such as a DLC film is easily accumulated inside the slow pipe 31 or the vent pipe 33 when the diameter of the slow pipe 31 or the vent pipe 33 increases. When a carbon film such as a DLC film is accumulated inside the slow pipe 31 or the vent pipe 33, the carbon film flies and flows into the treatment space S when the inside of the treatment space S is returned to the atmospheric pressure. Thus, there is a concern that contamination may occur.

However, in a case where the preliminary treatment method of the present embodiment is performed, it is possible to remove oxygen, hydrogen, or water stuck to a surface, on which the DLC film is intended to be formed, of the workpiece W and at the same time to remove the carbon film accumulated inside the treatment space S as described above. Here, even when the slow pipe 31 or the vent pipe 33 has a large diameter, the carbon film is not accumulated therein. Accordingly, it is possible to immediately perform an operation of depressurizing the inside of the treatment space S or returning the pressure to the atmospheric pressure.

Figure 4:
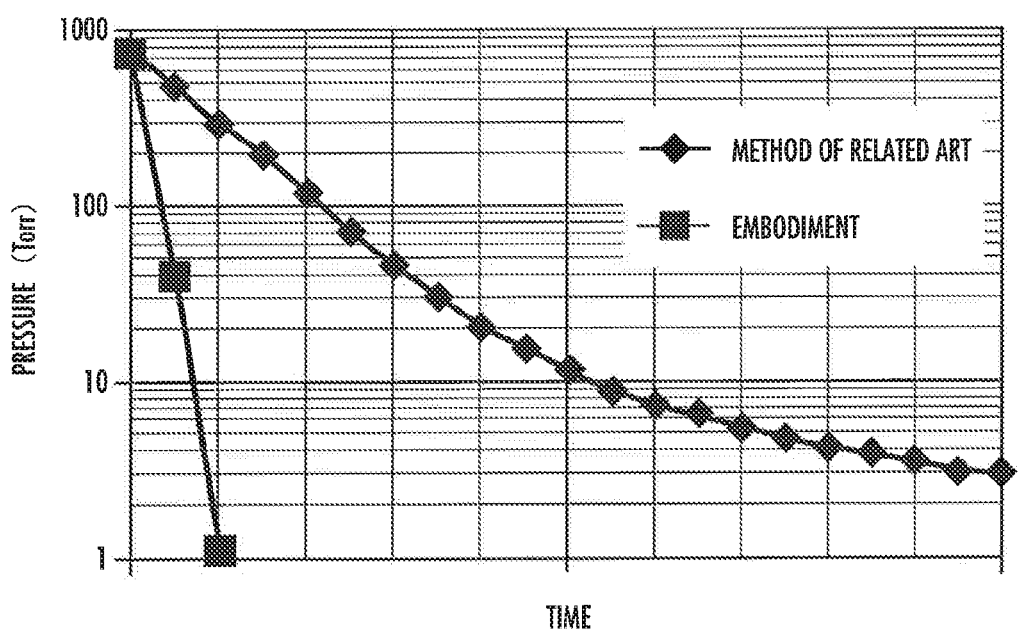
FIG. 4 is a graph illustrating a relation between a vacuum degree and a pressure reduction time of the treatment space.

FIG. 4 illustrates a relation between a vacuum degree and a time for depressurizing the inside of the treatment space S. From FIG. 4, when the preliminary treatment method of the present embodiment is performed and the slow pipe 31 or the vent pipe 33 has a large diameter, it is understood that the time taken for the depressurization to, for example, 666.5 Pa (5 Torr) can be made to about 1/10 of a case where the slow pipe 31 or the vent pipe 33 has a small diameter in the conventional method.

Figure 5:
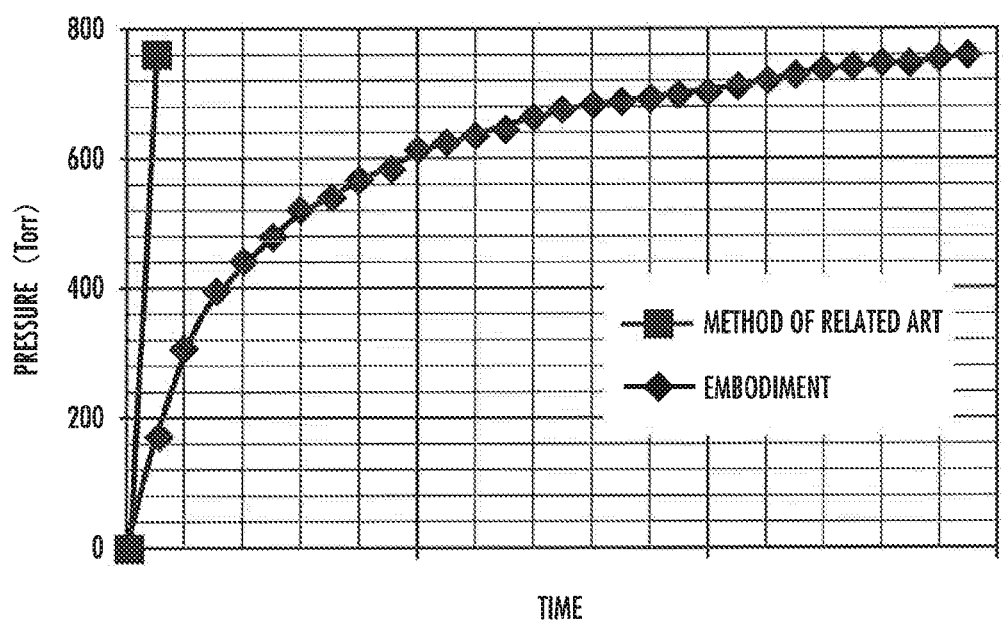
FIG. 5 is a graph illustrating a relation between a pressure and a time when the treatment space is returned to an atmospheric pressure.

Further, FIG. 5 illustrates a relation between a pressure and a time when the treatment space S is returned to the atmospheric pressure. From FIG. 5, the preliminary treatment method of the present embodiment is performed and the slow pipe 31 or the vent pipe 33 has a large diameter, it is understood that the time taken for returning to the atmospheric pressure (760 Torr) from the vacuumed state, may be about 1/50 of a case where the slow pipe 31 or the vent pipe 33 has a small diameter in the conventional method.

Figure 6:
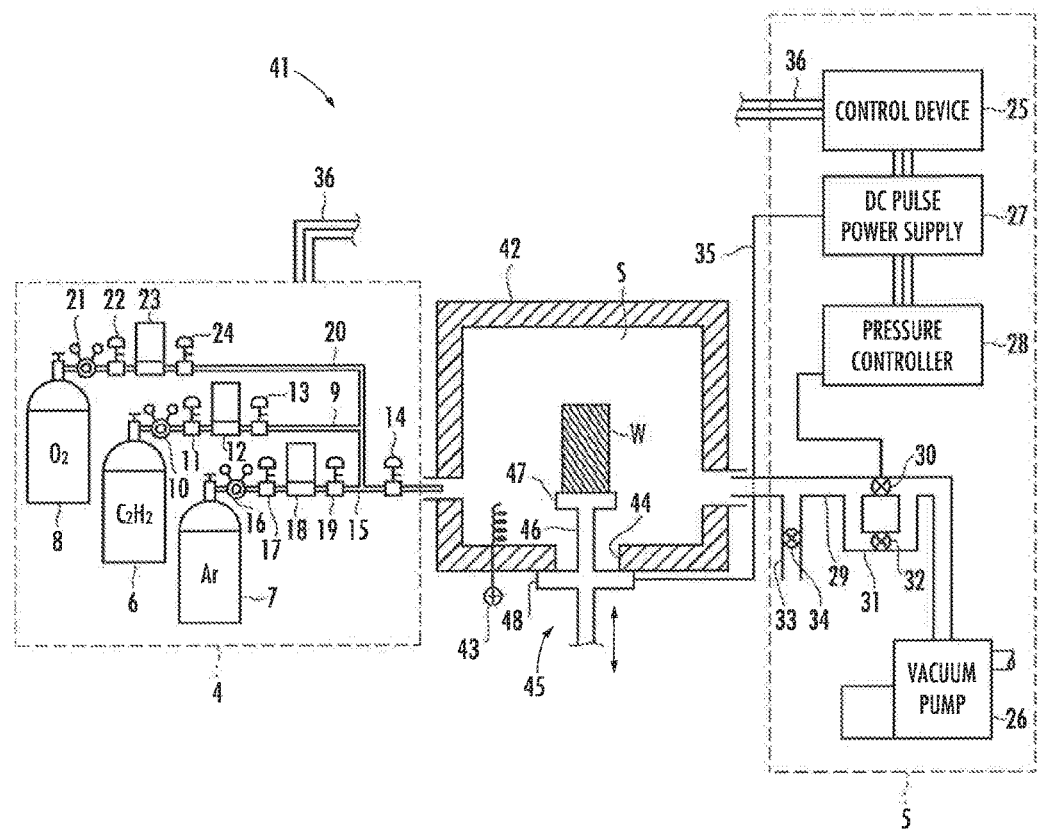
FIG. 6 is a system configuration diagram illustrating a configuration example of a plasma CVD device that is used in the preliminary treatment method for the workpiece of the invention.

In the present embodiment, a case has been described in which the workpiece W is a hollow cylindrical conductor, but the workpiece W may be a solid conductor. In this case, the workpiece W is, for example, a piston or the like of an internal combustion engine. Then, the preliminary treatment method of the invention and the formation of the DLC film may be performed by using a plasma CVD device 41 shown in FIG. 6.

The plasma CVD device 41 includes a chamber 42 which is capable of storing the solid workpiece W and capable of sealing, an anode 43 which is disposed inside the chamber 42, the gas supply subsystem 4, and the process control subsystem 5.

The chamber 42 includes a penetration hole 44 which is formed in the bottom portion and an elevation member 45 having conductivity and which is movable upward and downward through the penetration hole 44. The elevation member 45 includes a rod 46, a table 47 which is provided at the top of the rod 46, and a lid member 48 which is provided in the rod 46 at the lower portion of the table 47 and closes the penetration hole 44, and the workpiece W is placed on the table 47.

Since the gas supply subsystem 4 has completely the same configuration as the plasma CVD device 1 shown in FIG. 1 except that the guide pipe 9 is connected to the chamber 42 through the switching valve 14, the same reference numerals will be given to the same components and the detailed description thereof will not be presented. Further, since the process control subsystem 5 has completely the same configuration as the plasma CVD device 1 shown in FIG. 1 except that the DC cable 35 is connected to the elevation member 45, the same reference numerals will be given to the same components and the detailed description thereof will not be presented.

The plasma CVD device 41 is operated in completely the same way as the plasma CVD device 1 shown in FIG. 1 except that the inside of the chamber 42 is formed as the treatment space S. Accordingly, according to the plasma CVD device 41, it is possible to perform the preliminary treatment for the workpiece W and to clean the inside the treatment space S by the operations of STEP 2 to STEP 9 of the flowchart shown in FIG. 2 and hence to form the DLC film on the outer surface of the workpiece W.

EXPLANATIONS OF NUMERALS

1, 41 PLASMA CVD DEVICE
3, 43 ANODE
6 ACETYLENE GAS SUPPLY CONTAINER
8 OXYGEN GAS SUPPLY CONTAINER
27 DC PULSE POWER SUPPLY
S TREATMENT SPACE
W WORKPIECE

The invention claimed is:

1. A method for forming a carbon film on a workpiece, comprising a step of forming the carbon film on a surface of a conductive workpiece at least partially exposed to a treatment space maintained in a predetermined vacuum degree, and a preliminary treatment step which is performed before the step of forming the carbon film, the method performed with the conductive workpiece at least partially exposed to the treatment space maintained in the predetermined vacuum degree, by applying bias voltage to an anode disposed in the treatment space by setting the workpiece as a cathode while a material gas formed of a hydrocarbon compound is supplied to the treatment space, and generating plasma of the material gas along the surface of the workpiece, wherein the preliminary treatment step applies bias voltage to the workpiece at least partially exposed to the treatment space while oxygen gas is supplied to the treatment space, generates oxygen plasma along the surface of the workpiece, and reduces hydrogen stuck to the surface of the workpiece by the oxygen plasma in such a manner that Kurtosis of the carbon film is reduced less than 100, wherein the Kurtosis expresses a nodule in the carbon film originating from the hydrogen.

2. The method according to claim 1,
wherein the workpiece is a workpiece formed in a cylindrical shape, both ends of the workpiece are sealed by a pair of cylindrical sealing members having an insulation property, the treatment space is formed inside the sealing members and the workpiece sealed by the sealing members, and the anode is disposed in the sealing members.

3. The method according to claim 1,
wherein the workpiece is a workpiece formed in a solid shape, the treatment space is formed inside a chamber for disposing the workpiece therein, and the anode is disposed inside the chamber.

4. The method according to claim 1,
wherein carbon film accumulated inside the treatment space is removed by the oxygen plasma.

5. The method according to claim 1,
wherein argon plasma is generated along the surface of the workpiece after the oxygen plasma is generated and also before the plasma of material gas is generated.

* * * * *